US011456153B2

United States Patent
Yasui

(10) Patent No.: US 11,456,153 B2
(45) Date of Patent: Sep. 27, 2022

(54) CHARGED PARTICLE BEAM WRITING METHOD AND CHARGED PARTICLE BEAM WRITING APPARATUS

(71) Applicant: NuFlare Technology, Inc., Yokohama (JP)

(72) Inventor: Kenichi Yasui, Kawasaki (JP)

(73) Assignee: NuFlare Technology, Inc., Yokohama (JP)

( * ) Notice: Subject to any disclaimer, the term of this patent is extended or adjusted under 35 U.S.C. 154(b) by 371 days.

(21) Appl. No.: 16/831,979

(22) Filed: Mar. 27, 2020

(65) Prior Publication Data

US 2020/0357605 A1    Nov. 12, 2020

(30) Foreign Application Priority Data

May 8, 2019 (JP) ............................. JP2019-088437

(51) Int. Cl.
*H01J 37/317* (2006.01)
*G03F 7/20* (2006.01)
*H01J 37/304* (2006.01)

(52) U.S. Cl.
CPC ........ *H01J 37/3174* (2013.01); *G03F 7/2037* (2013.01); *H01J 37/304* (2013.01)

(58) Field of Classification Search
CPC .... H01J 37/3174; H01J 37/304; G03F 7/2037
See application file for complete search history.

(56) References Cited

U.S. PATENT DOCUMENTS

2009/0200488 A1  8/2009 Yashima et al.
2016/0211118 A1  7/2016 Yashima

FOREIGN PATENT DOCUMENTS

| JP | 2009-32904 A | 2/2009 |
| JP | 2009-194062 A | 8/2009 |
| JP | 2016-134567 A | 7/2016 |

*Primary Examiner* — Nicole M Ippolito
*Assistant Examiner* — Hanway Chang
(74) *Attorney, Agent, or Firm* — Oblon, McClelland, Maier & Neustadt, L.L.P.

(57) ABSTRACT

In one embodiment, a charged particle beam writing method includes dividing a figure pattern defined in writing data into a plurality of shot figures, virtually dividing a writing target substrate into a plurality of mesh regions, and calculating a correction irradiation amount to correct proximity effect and middle range effect for each of the mesh regions based on a position of the figure pattern, calculating an irradiation amount for each of the plurality of shot figures using the correction irradiation amount, calculating an insufficient irradiation amount at an edge portion of the shot figure based on the irradiation amount, resizing the shot figure based on the insufficient irradiation amount, and writing the resized shot figure on the writing target substrate using a charged particle beam in the irradiation amount.

14 Claims, 8 Drawing Sheets

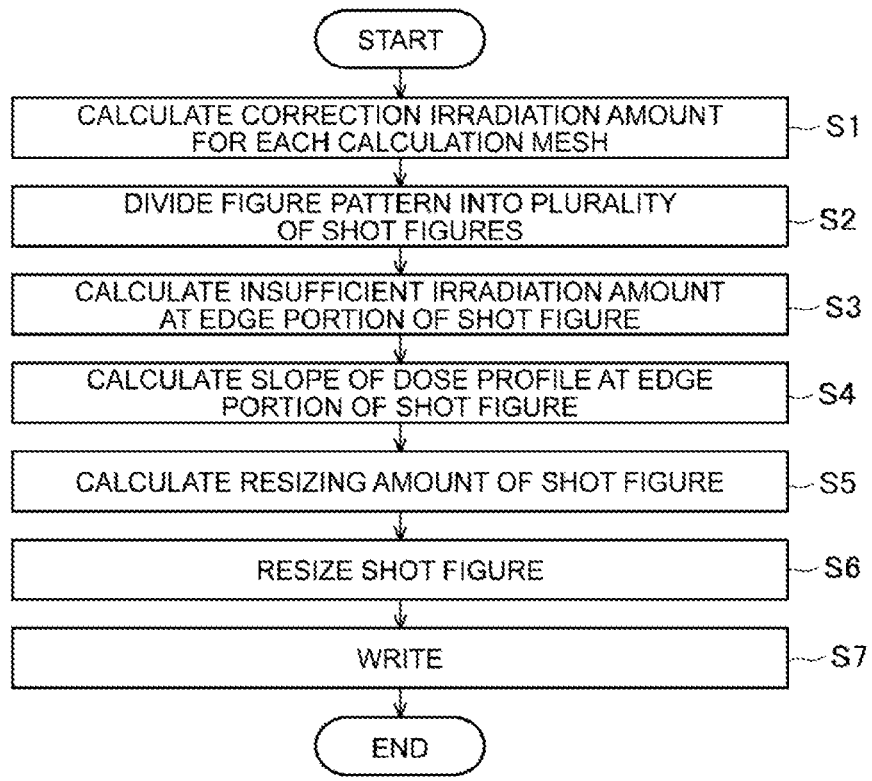
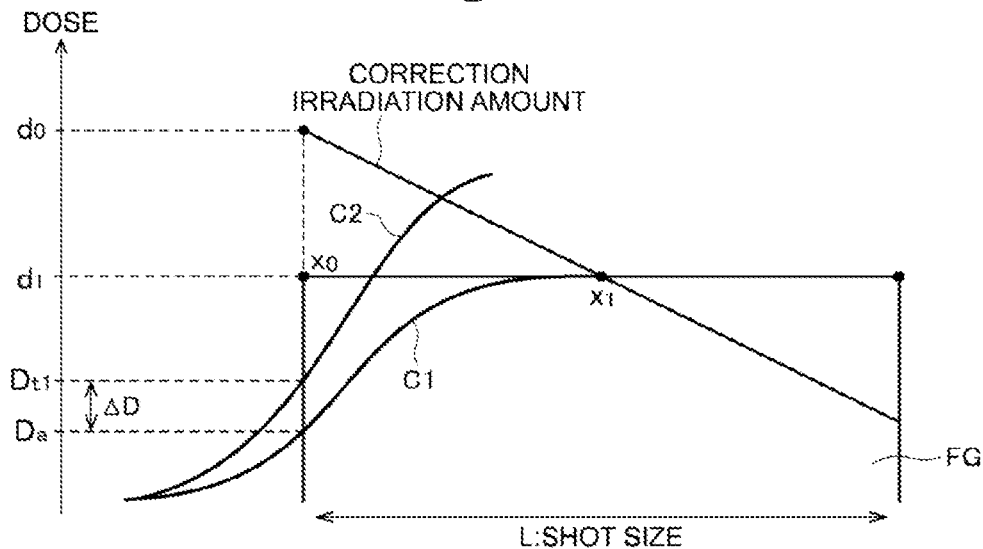

CHARGED PARTICLE BEAM WRITING METHOD AND CHARGED PARTICLE BEAM WRITING APPARATUS

CROSS REFERENCE TO RELATED APPLICATION

This application is based upon and claims benefit of priority from the Japanese Patent Application No. 2019-88437, filed on May 8, 2019, the entire contents of which are incorporated herein by reference.

FIELD

The present invention relates to a charged particle beam writing method and a charged particle beam writing apparatus.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a photomask pattern is employed. A highly precise original image pattern is written by using an electron beam writing apparatus, in which a technology commonly known as electron beam lithography is used.

A so-called proximity effect problem is known. The problem is such that electrons, with which a substrate surface is irradiated at the time electron beam writing, are scattered (forward scattered) in a resist, reflected (back scattered) from the substrate, thereby causing a dimensional variation of a pattern. As one of methods for correcting the proximity effect, an irradiation amount correction method is known. This is a correction method by which an irradiation amount is determined position by position based on the size and crude density of a pattern in the surroundings of a beam irradiation position.

In the irradiation amount correction, a backscattering irradiation amount is calculated, where the backscattering occurs when an electron beam, with which a photomask is irradiated, is reflected by a substrate, and a resist is exposed to the electron beam again. The calculation is sped up by using a sum of products (convolution) between a pattern density map and a gaussian kernel as a backscattering distribution function, the pattern density map representing information on a pattern within a layout by a mesh of several μm side, for instance. The influence range of the proximity effect is approximately 10 μm, and the calculation mesh size in the irradiation amount correction is approximately several μm.

In recent years, there has been an increasing need for middle range effect correction that corrects a line width error due to backscattering and/or a process specific to an EUV substrate with an influence range of from several hundred nm to several μm. The calculation mesh size of the middle range effect correction is approximately several hundred nm.

As illustrated in FIG. 11, conventionally, an electron beam writing apparatus calculates the centroid coordinates of a shot figure on a calculation mesh, interpolation-calculates mesh values D11 to D14 around the centroid to determine an irradiation amount for the shot figure. However, when a shot size is larger than a middle range effect correction mesh size, at an edge portion of a shot, the difference between the irradiation amount for the shot and a correction irradiation amount calculated by correction calculation is increased.

For instance, as illustrated in FIG. 12, the case where the shot size of a shot SH1 is larger than the mesh size of a calculation mesh is discussed. An irradiation amount D1 for the shot SH1 is calculated from correction irradiation amounts (mesh values) in calculation meshes ME1, ME2 around (in the vicinity of) the center of the shot SH1. Meanwhile, the edge portion on the left side of the figure of the shot SH1 is at the position of a calculation mesh ME0, and the correction irradiation amount is D0. Therefore, at the edge portion of the shot SH1, the irradiation amount is insufficient by ΔD (=D1−D2), and a writing pattern dimension (resolution line width) is smaller than a design value.

To cope with this problem, a method may be adopted in which a maximum shot size is reduced, or the shot is finely divided near the edge, but the number of shots is increased, and a writing time becomes longer. Even when a maximum shot size is sufficiently reduced, forward scattering contribution at a pattern edge is ½ of the incident dose in a conventional theory of proximity effect correction, and this precondition is not satisfied in middle range effect correction having a dose slope in the vicinity of an edge, thus residual correction occurs, and degradation of writing accuracy is caused.

BRIEF DESCRIPTION OF THE DRAWINGS

FIG. 3 is a flowchart illustrating a writing method according to the embodiment.

FIG. 4 is a chart illustrating a dose profile.

DETAILED DESCRIPTION

In one embodiment, a charged particle beam writing method includes dividing a figure pattern into a plurality of shot figures in a size, each of which allows to be irradiated with a shot of a charged particle beam, by use of writing data defining the figure pattern, virtually dividing a writing region of a writing target substrate into a mesh pattern which is a plurality of mesh regions, and calculating a correction irradiation amount to correct proximity effect and middle range effect for each of the plurality of mesh regions based on a position of the figure pattern, the middle range effect having an influence radius shorter than an influence radius of the proximity effect, calculating an irradiation amount for each of the plurality of shot figures using the correction irradiation amount, calculating an insufficient irradiation amount at an edge portion of the shot figure based on the irradiation amount, resizing the shot figure based on the insufficient irradiation amount, and writing the resized shot figure on the writing target substrate using a charged particle beam in the irradiation amount. An embodiment of the present invention will be described below with reference to the drawings. In the embodiment, a configuration using an electron beam as an example of a charged particle beam will be described. The charged particle beam is not limited to the electron beam. For example, the charged particle beam may be an ion beam.

Figure 1:
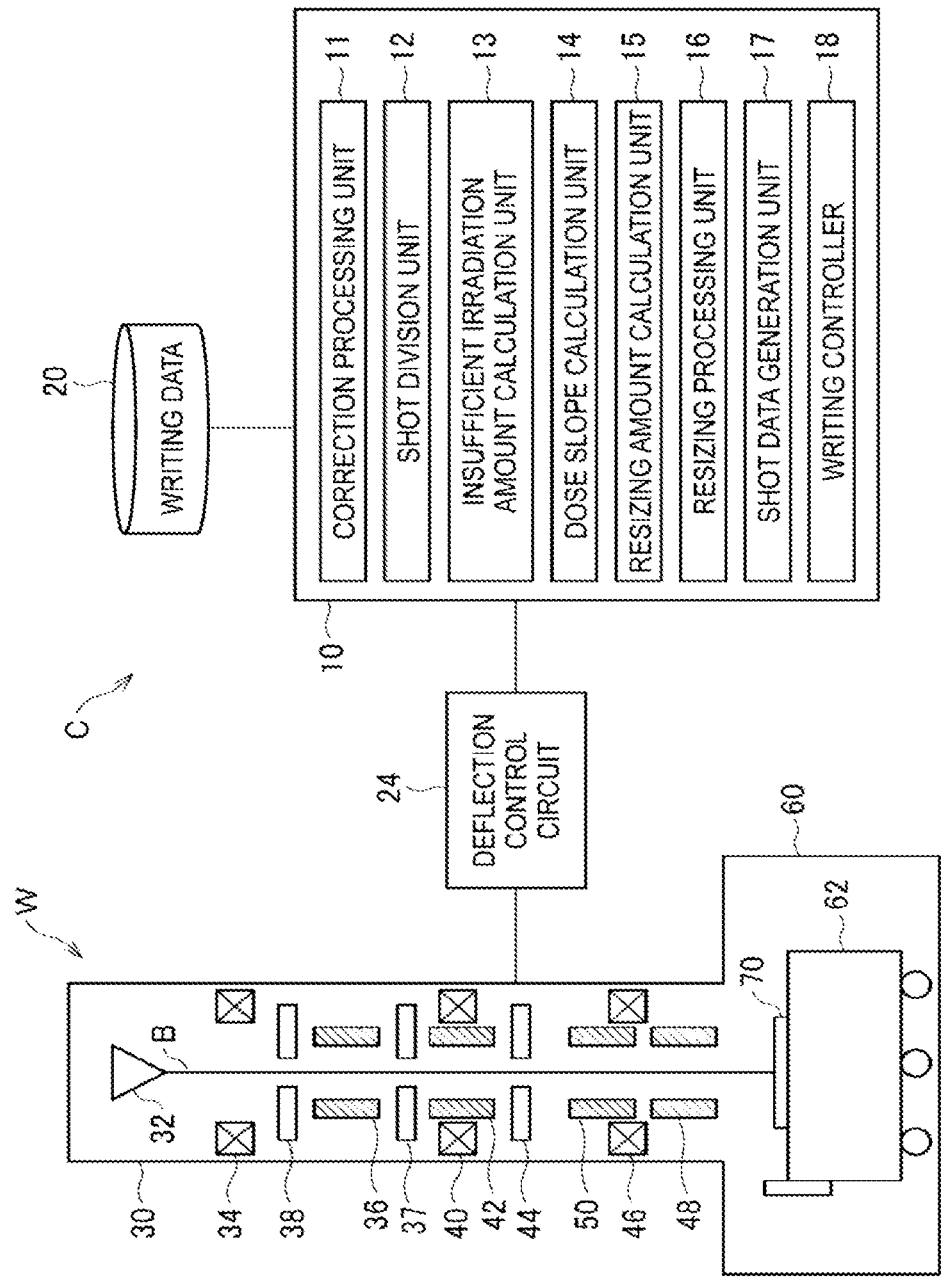
FIG. 1 is a schematic diagram of an electron beam writing apparatus according to an embodiment of the present invention.

FIG. 1 is a schematic diagram of an electron beam writing apparatus according to an embodiment of the present invention. The electron beam writing apparatus illustrated in FIG. 1 is a variable shaped beam writing apparatus including a controller C and a writer W.

The writer W includes a column 30 and a writing chamber 60. In the column 30, an electron gun 32, an illuminating lens 34, a blanker 36, a blanking aperture plate 37, a first shaping aperture plate 38, a projection lens 40, a shaping deflector 42, a second shaping aperture plate 44, an objective lens 46, a main deflector 48, and a sub-deflector 50 are disposed.

In the writing chamber 60, an XY stage 62 is disposed. A substrate 70 as a writing target is placed on the XY stage 62. The substrate 70 is a mask for exposure at the time of manufacturing a semiconductor device, or a semiconductor substrate (silicon wafer) on which a semiconductor circuit is written. Alternatively, the substrate 70 may be a mask blanks to which a resist is applied and on which nothing has been written yet.

Figure 2:
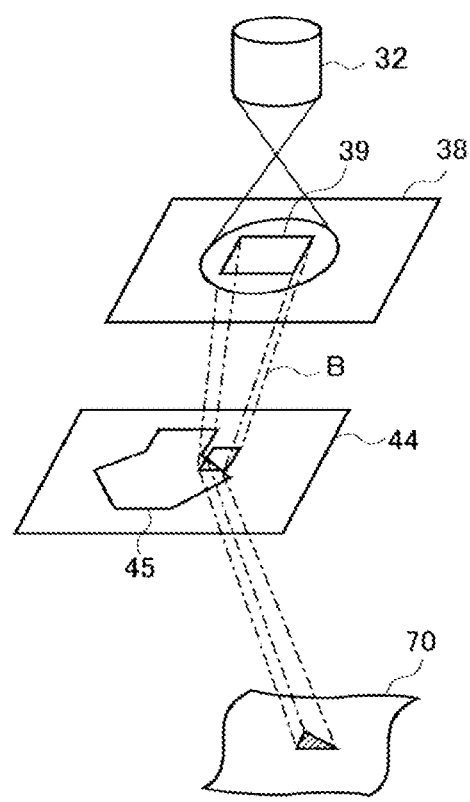
FIG. 2 is a perspective view of a first shaping aperture plate and a second shaping aperture plate.

The first shaping aperture plate 38 having a rectangular opening 39 (see FIG. 2) is irradiated with an electron beam B by the illuminating lens 34, the electron beam B being discharged from the electron gun 32 (discharge unit) provided in the column 30. The electron beam B is shaped into a rectangle by passing through the opening 39 of the first shaping aperture plate 38.

When the electron beam B having a first aperture image (rectangle), which has passed through the first shaping aperture plate 38, passes through the blanker 36 (blanking deflector), whether the substrate 70 is irradiated or not is switched by the blanker 36. When beam off is set by the blanker 36, the electron beam B is deflected so as to be shielded by the blanking aperture plate 37. When beam on is set, control is performed so that the electron beam B passes through the blanking aperture plate 37.

The electron beam B having the first aperture image (rectangle), which has passed through the blanking aperture plate 37, is projected on the second shaping aperture plate 44 having an opening 45 (see FIG. 2) by the projection lens 40. At this point, the first aperture image (rectangle) projected on the second shaping aperture plate 44 is deflection-controlled by the shaping deflector 42, and the shape and size of the electron beam which passes through the opening 45 can be changed (variable shaping can be performed). In addition, when the electron beam B having the first aperture image (rectangle) is all controlled so as to pass through the opening 45 of the second shaping aperture plate 44, it is also possible not to change the shape and size of the electron beam having the first aperture image (rectangle).

The electron beam B having a second aperture image, which has passed through the opening 45 of the second shaping aperture plate 44, is focused by the objective lens 46, deflected by the main deflector 48 and the sub-deflector 50, and a target position of the substrate 70 placed on the XY stage 62 which moves continuously is irradiated with the electron beam B.

The controller C has a control computer 10, storage devices 20, 22, and a deflection control circuit 24. Writing data (layout data) including multiple graphic patterns is inputted from the outside and stored in the storage device 20.

The control computer 10 has a correction processing unit 11, a shot division unit 12, an insufficient irradiation amount calculation unit 13, a dose slope calculation unit 14, a resizing amount calculation unit 15, a resizing processing unit 16, a shot data generation unit 17, and a writing controller 18.

Each component of the control computer 10 may be configured by hardware such as an electrical circuit, or configured by software. When each component is configured by software, a program which implements at least part of the functions of the control computer 10 may be stored in a recording medium, and the program may be read and executed by a computer including an electrical circuit. The recording medium is not limited to a detachably medium such as a magnetic disk or an optical disk, and may be a fixed recording medium such as a hard disk drive or a memory.

The electron beam writing apparatus is used for pattern writing or the like on a photomask. For production of a photomask, a quartz substrate provided with a light-shielding film such as a chromium film, and a resist is first prepared, and a desired pattern is written on the resist by the electron beam writing apparatus. After the writing, an exposed portion (or an unexposed portion) of the resist is dissolved and removed by developing treatment, and a resist pattern is formed. Subsequently, the resist pattern is masked, dry etching processing is performed thereon by a dry etching device, and a light-shielding film is processed. After this, the resist is peeled off, and a photomask is produced.

In electron beam writing, a dimensional variation of a pattern occurs by the influence of scattered electrons, thus it is necessary to reduce the dimensional variation by correcting an irradiation amount. In the present embodiment, proximity effect and middle range effect are corrected, and correction (resizing) of the shot size is performed so that residual correction is reduced.

The writing method according to the present embodiment will be described with reference to the flowchart illustrated in FIG. 3.

First, the correction processing unit 11 reads writing data from the storage device 20, and calculates a correction irradiation amount D(x) for correcting the dimensional variation due to the influence of the proximity effect and the middle range effect using a figure pattern defined in the writing data (step S1). The correction irradiation amount is determined by the integral equation given by the following Expression 1. For instance, a writing region of a substrate is virtually divided into calculation meshes (mesh regions) in a mesh size of approximately several hundred nm, and the correction irradiation amount D(x) is calculated for each calculation mesh.

$$K\left[\frac{D(x)}{2} + \eta \int_p D(x')gb(x-x')dx'\right] = C \qquad \text{Expression 1}$$

C is an absorbed amount of a resist and a constant value in Expression 1. K is a coefficient of conversion from an irradiation dose amount to stored energy. η is a correction coefficient. gb(x) is a Gaussian function that represents the influence distribution of the proximity effect and the middle range effect.

The size of a figure pattern defined in the writing data is normally larger than a shot size which can be formed by a single shot with the writer W. Thus, the shot division unit 12 divides each figure pattern into a plurality of shot figures so that each shot figure has a size formable by a single shot (step S2).

As illustrated in FIG. 4, when attention is focused on one shot figure FG, the irradiation amount for the shot figure FG is given by a correction irradiation amount $d_1$ at a position $x_1$ of the centroid (center) of the shot figure FG, and the correction irradiation amount $d_1$ is calculated by interpolation-calculating correction irradiation amounts (mesh values) in the vicinity of the position.

A correction irradiation amount $d_0$ at an edge portion of the shot figure FG is calculated by interpolation-calculating correction irradiation amounts (mesh values) in the vicinity of the position. The correction irradiation amount $D(x)$ in the region where the shot figure FG is written can be expressed by the linear formula given by the following Expression 2.

$$D(x) = d_0 + \alpha \cdot r \qquad \text{Expression 2}$$

In Expression 2, r is the x coordinate (position in the x direction). Also, α is the slope of the correction irradiation amount, $\alpha = (d_1 - d_0)/(x_1 - x_0)$ A curve C1 illustrated in FIG. 4 shows a dose profile used for middle range effect correction processing. Forward scattering contribution at the edge portion of the shot figure FG is ½ of the irradiation amount for the shot figure FG in the theory of proximity effect correction. Therefore, an irradiation amount Da at the edge portion of the shot figure FG is $d_1/2$.

A curve C2 illustrated in FIG. 4 shows a dose profile when irradiation is made with the correction irradiation amount D(x) given by Expression 2. The value of the curve C2 at the edge portion of the shot figure FG is a target irradiation amount $D_{t1}$ at the edge portion. The target irradiation amount $D_{t1}$ can be determined by the following Expression 3.

$$D_{t1} = \int_{-\infty}^{\infty} D(x') gf(x-x')dx \qquad \text{Expression 3}$$

$$= \int_0^\infty (d_0 + \alpha \cdot \gamma) \exp\left(-\frac{r^2}{\sigma_f^2}\right)$$

$$= \frac{1}{2}d_0 + \frac{\alpha \sigma_f}{2\sqrt{\pi}}$$

In Expression 3, gf(x) is a Gaussian function that represents the influence distribution of forward scattering. $\sigma_f$ is the forward scattering influence radius.

Thus, the irradiation amount Da at the edge portion of the shot figure FG, calculated by middle range effect correction calculation is insufficient with respect to the target irradiation amount $D_{t1}$ by $\Delta D = D_{t1} - Da$. The insufficiency of the irradiation amount causes a shrinking in a pattern dimension, thus needs to be corrected. For the correction, the insufficient irradiation amount calculation unit 13 first calculates the insufficient irradiation amount ΔD at the edge portion of the shot figure FG using Expression 2, Expression 3 stated above (step S3).

The dose slope calculation unit 14 calculates a slope $S_{x0}$ (slope of the curve C1) of the dose profile represented by the curve C1, at the edge portion of the shot figure FG (step S4). The $S_{x0}$ can be calculated from the following Expression 4 to Expression 7.

$$D(x) = \frac{a_1}{2}\left\{\text{erf}\left(\frac{x-a}{\sigma_f}\right) - \text{erf}\left(\frac{x-b}{\sigma_f}\right)\right\} \qquad \text{Expression 4}$$

$$S_{x0} = \qquad \text{Expression 5}$$

$$\frac{dD(x)}{dx} = \frac{d_1}{\sqrt{\pi}\,\sigma_f}\left\{\exp\left(-\frac{(x-a)^2}{\sigma_f^2}\right) - \exp\left(-\frac{(x+a)^2}{\sigma_f^2}\right)\right\}$$

when $x = a$ $$S_{x0} = \frac{d_1}{\sqrt{\pi}\,\sigma_f}\left\{1 - \exp\left(-\frac{L^2}{\sigma_f^2}\right)\right\} \qquad \text{Expression 6}$$

if $L \gg \sigma_f$ $$S_{x0} = \frac{f_1}{\sqrt{\pi}\,\sigma_f} \qquad \text{Expression 7}$$

erf(x) in Expression 4 is an error function.

Figure 5:
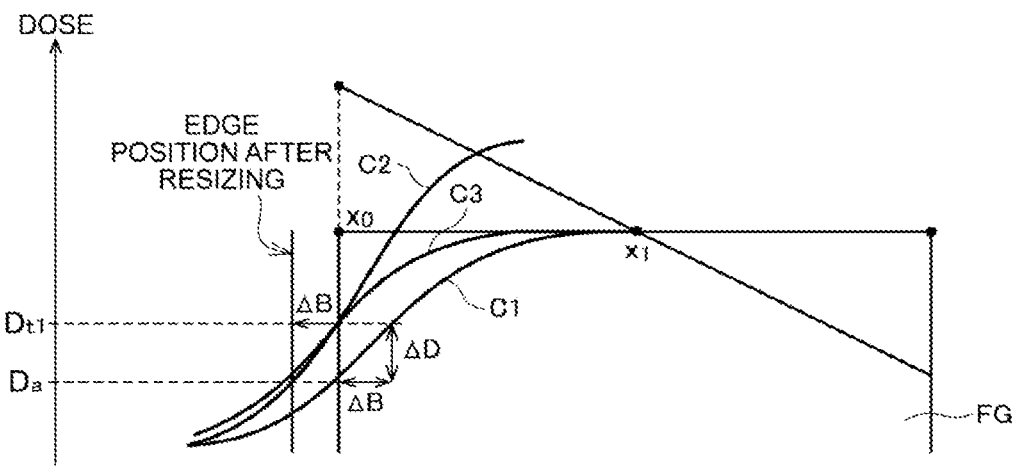
FIG. 5 is a chart illustrating a dose profile.

As illustrated in FIG. 5, the shot figure FG is resized, and the edge position is shifted by ΔB, thus the dose profile becomes as shown by a curve C3, and the irradiation amount at the original edge position $x_0$ is the target irradiation amount $D_{t1}$. The resizing amount calculation unit 15 calculates a resizing amount ΔB of the shot figure FG using the following Expression 8 (step S5).

$$\Delta B = \qquad \text{Expression 8}$$

$$\frac{\Delta D}{S_{x0}} = \frac{\frac{1}{2}d_0 + \frac{\alpha \sigma_f}{2\sqrt{\pi}} - \frac{1}{2}d_1}{\frac{d_1}{\sqrt{\pi}\,\sigma_f}} = \frac{\sqrt{\pi}\,\sigma_f}{2d_1}\left(d_0 + \frac{\alpha \sigma_f}{\sqrt{\pi}} - d_1\right)$$

The resizing processing unit 16 resizes the shot figure FG based on the resizing amount ΔB (step S6). The resizing processing is performed on both edge portions of the shot figure FG.

The shot data generation unit 17 generates shot data for shooting the shot figure FG. The shot data includes a shot position, a shot size, and an irradiation time. The irradiation time is the value obtained by dividing the irradiation amount $d_1$ of the shot figure FG by a current density.

The writing controller 18 transfers the shot data to the deflection control unit 24. The deflection control unit 24 controls a deflection amount of each deflector based on the shot data, and writes a figure pattern on the substrate 70 (step S7). The processing in steps S3 to S7 is performed on all shot figures generated by the shot division unit 12 dividing the figure pattern.

In this manner, the edge position of the shot figure is shifted by a distance corresponding to the insufficient irradiation amount at the edge portion of the shot figure, and the shot figure is resized, thus the difference between the dimension of a resolution pattern and a design dimension is reduced, and the dimensional accuracy and positional accuracy of the writing pattern can be improved.

In the embodiment described above, a target irradiation amount $D_{t2}$ may be set to ½ of the correction irradiation amount $d_0$ at the edge portion of the shot figure FG. In this case, the insufficient irradiation amount ΔD is given by $\Delta D = d_0/2 - d_1/2$. The resizing amount $\Delta B$ can be calculated from the following Expression 9.

$$\Delta B = \frac{\Delta D}{S_{x0}} = \frac{\frac{1}{2}d_0 - \frac{1}{2}d_1}{\frac{d_1}{\sqrt{\pi}\sigma_f}} = \frac{\sqrt{\pi}\sigma_f}{2}\left(\frac{d_0}{d_1} - 1\right) \quad \text{Expression 9}$$

The resizing processing unit 16 resizes the shot figure FG based on the calculated resizing amount $\Delta B$.

Although a point for evaluating an irradiation amount has been described one-dimensionally, it is preferable that the evaluation points be the centroid of the figure, and an intersection point between each edge (each side of the figure) and the perpendicular line from the centroid to the edge.

Figure 6A:
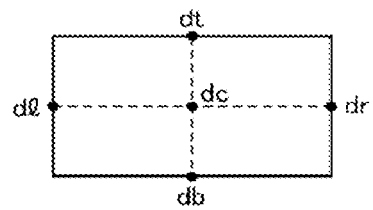
FIG. 6A and FIG. 6B are figures illustrating examples of setting evaluation points.

FIG. 6A illustrates a centroid dc of a rectangle, and intersection points dt, db, dl, dr at which a perpendicular line from the centroid dc to four sides intersects a corresponding side. For instance, a first irradiation amount is calculated from the correction irradiation amount for the mesh regions around the centroid dc, and a second irradiation amount is calculated from the correction irradiation amount for the mesh regions around the intersection point dt. An insufficient irradiation amount is determined using the difference between the first irradiation amount and the second irradiation amount, and a resizing amount of the edge (side) including the intersection point dt.

Figure 6B:
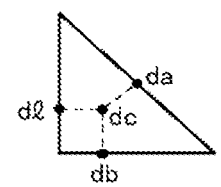

FIG. 6B illustrates a centroid dc of a triangle, and intersection points db, dl, da at which a perpendicular line from the centroid dc to three sides intersects a corresponding side.

Figure 7:
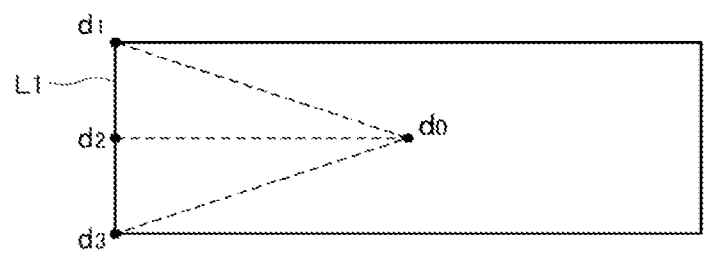
FIG. 7 is a figure illustrating an example of setting evaluation points.

A plurality of evaluation points are provided on one edge (side). For instance, in the example illustrated in FIG. 7, three evaluation points d1, d2, d3 are provided on one side L1. d0 is the centroid. d1, d3 are end points of the side L1. d2 is the intersection point between the perpendicular line from the centroid d0 to the side L1, and the side L1. The first irradiation amount is calculated from the correction irradiation amount for the mesh regions around the centroid d0. The second irradiation amount is calculated from the correction irradiation amount for the mesh regions around each of d1, d2, d3.

An insufficient irradiation amount is calculated using the first irradiation amount and the second irradiation amount at the evaluation point d1, and a resizing amount at the evaluation point d1 is calculated from the insufficient irradiation amount. Similarly, an insufficient irradiation amount is calculated using the first irradiation amount and the second irradiation amount at the evaluation point d2, and a resizing amount at the evaluation point d2 is calculated from the insufficient irradiation amount. An insufficient irradiation amount is calculated using the first irradiation amount and the second irradiation amount at the evaluation point d3, and a resizing amount at the evaluation point d3 is calculated from the insufficient irradiation amount. The average value of the respective resizing amounts at the evaluation points d1, d2, d3 is set to the resizing amount of the side L1. Alternatively, the resizing amount may be calculated by taking a weighted average using an angle to the centroid d0 as a weight.

Figure 8A:
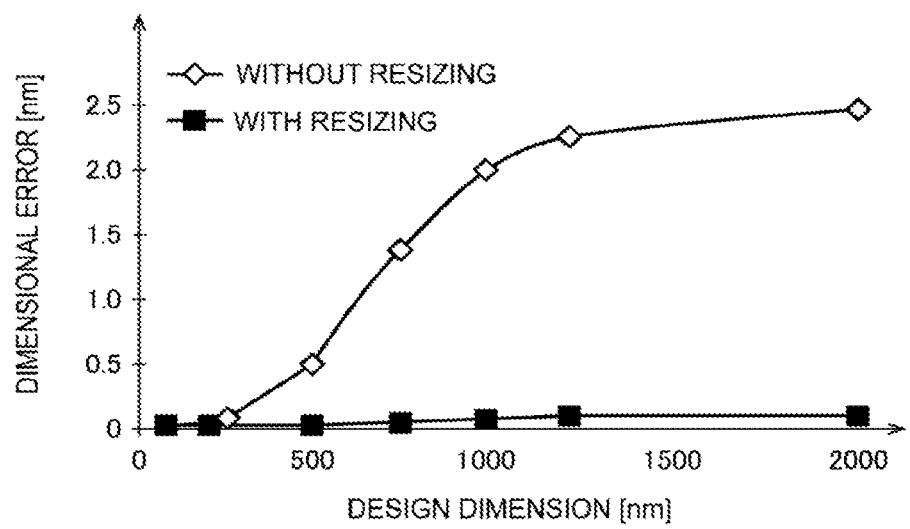
FIG. 8A is a graph illustrating an example of a dimensional error.
Figure 8B:
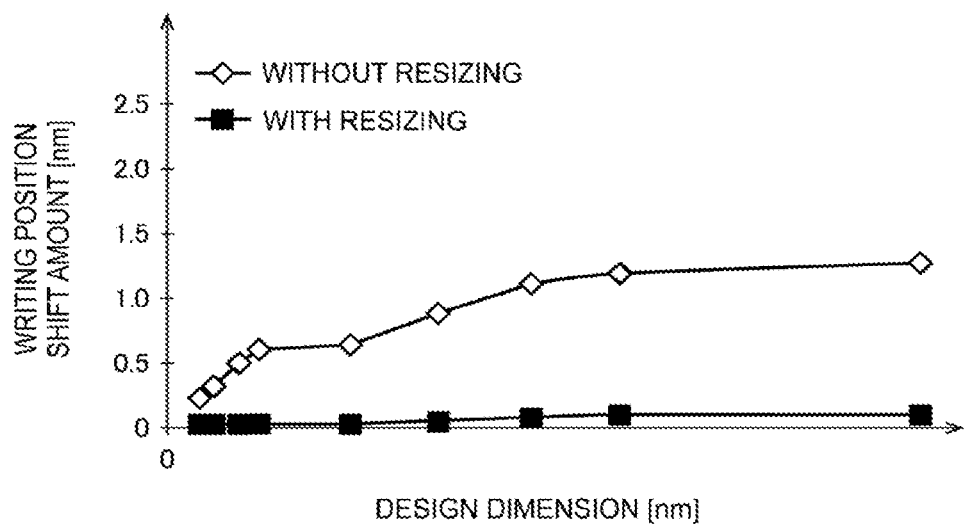
FIG. 8B is a graph illustrating an example of a writing position shift amount.

FIGS. 8A, 8B illustrate examples of a dimensional error of a writing pattern and a shift amount of a writing position when the resizing processing described in the embodiment is performed and when the resizing processing is not performed. It has been verified that the dimensional accuracy and the positional accuracy are improved by performing the resizing processing.

When one beam size can be sufficiently reduced as with a multi charged beam writing apparatus, correction calculation can be performed by adding terms to the correction expressions for the proximity effect as shown by the following Expression 10 to Expression 14, the terms in consideration of an insufficient amount of forward scattering.

$$K\left[\frac{D(x)}{2} - \left\{D(x)\int_{p}\overset{\overset{\text{Added term in consideration of}}{\text{insufficient amount of foward scattering}}}{\underset{\text{Forward scattering kernal}}{gf}}(x-x')dx' - \int_{p}D(x')gf(x-x')dx'\right\}\right] + \eta\int_{p}\frac{D(x')gb}{(x-x')dx'} = C \quad \text{Expression 10}$$

$$d(x) = \sum_{n=1}^{\infty} d_n(x) \quad \text{Expression 11}$$

$$d_1(x) = \frac{\frac{1}{2} + \eta}{\frac{1}{2} + \eta U(x)} \quad \text{Expression 12}$$

$$U(x) = \int_{p} gb(x-x')dx' \quad \text{Expression 13}$$

$$d_n(x) = d_n^p(x) + \frac{d_{n-1}(x)\int_{p}gf(x-x')dx' - \int_{p}d_{n-1}(x')gf(x-x')dx'}{\frac{1}{2} + \eta U(x)} \quad \text{Expression 14}$$

The invention is also applicable to a multi charged beam writing apparatus. Hereinafter the case will be described where the invention is applied to a multi charged beam writing apparatus.

Figure 9:
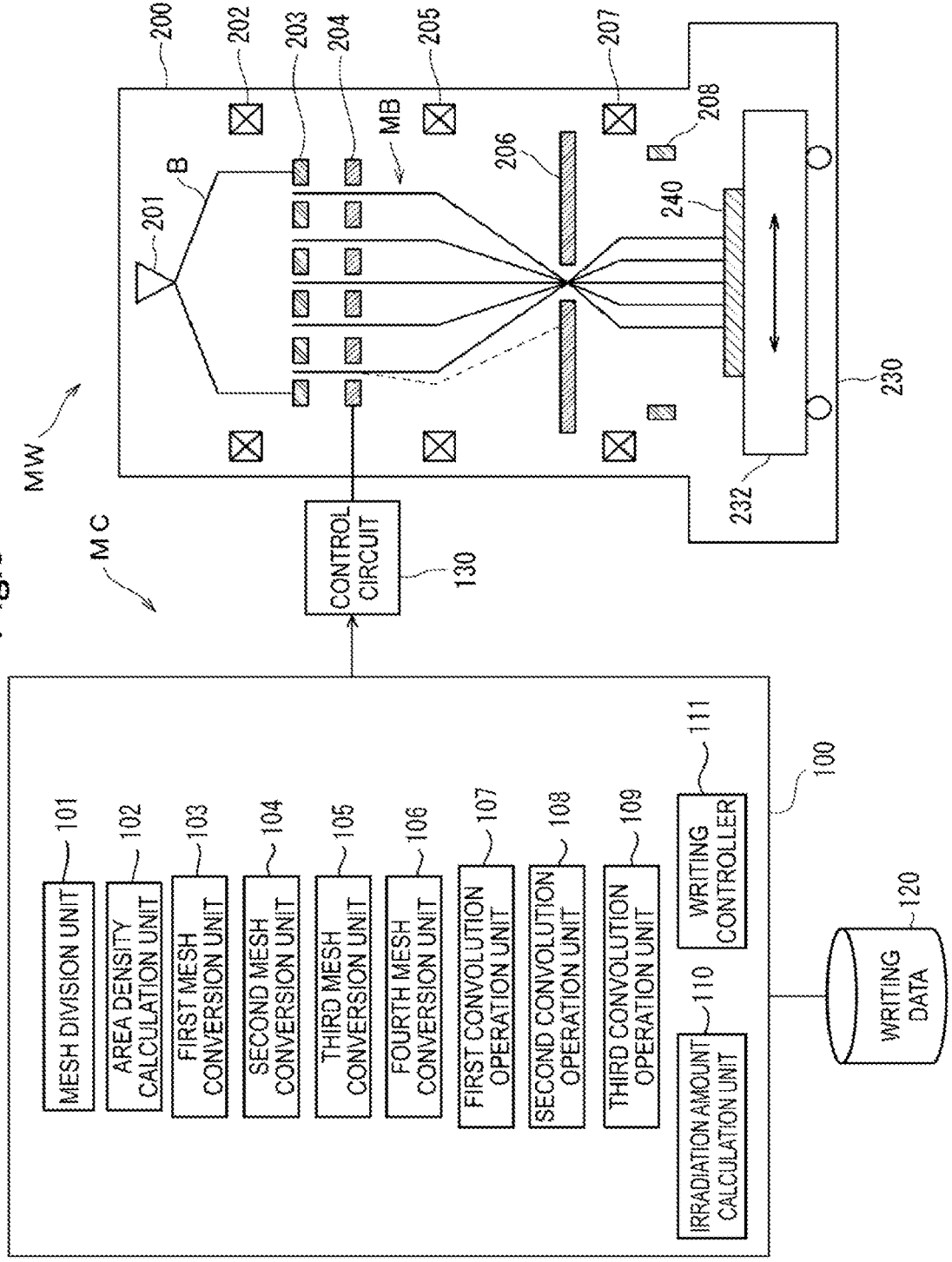
FIG. 9 is a schematic diagram of an electron beam writing apparatus according to another embodiment.

FIG. 9 is a schematic diagram of a multi charged beam writing apparatus. The multi charged beam writing apparatus includes a controller MC and a writer MW. The writer MW includes an electronic column 200 and a writing chamber 230. In the electronic column 200, an electron gun 201, an illuminating lens 202, a shaping aperture member 203, a blanking plate 204, a reducing lens 205, a limiting aperture member 206, an objective lens 207, and a deflector 208 are disposed. The reducing lens 205 and the objective lens 207 are both comprised of an electromagnetic lens, and a reducing optical system is formed by the reducing lens 205 and the objective lens 207.

In the writing chamber 230, an XY stage 232 is disposed. A substrate 240 as a writing target is placed on the XY stage 232. The substrate 240 is a mask for exposure at the time of manufacturing a semiconductor device, a semiconductor substrate (silicon wafer) on which a semiconductor circuit is written, or a mask blanks to which a resist is applied and on which nothing has been written yet.

The controller MC includes a control computer 100, a storage device 120 such as a magnetic disk, and a control circuit 130. The control computer 100 has a mesh division unit 101, an area density calculation unit 102, a first mesh conversion unit 103, a second mesh conversion unit 104, a third mesh conversion unit 105, a fourth mesh conversion unit 106, a first convolution operation unit 107, a second convolution operation unit 108, a third convolution operation unit 109, an irradiation amount calculation unit 110, and a writing controller 111. Each component of the control computer 100 may be configured by hardware such as an electrical circuit, or may be configured by software. When each component is configured by software, a program which implements at least part of the functions may be stored in a recording medium, and the program may be read and executed by a computer including an electrical circuit.

In the shaping aperture member 203, a plurality of openings are formed vertically (the y direction) and horizontally (the x direction) with a predetermined arrangement pitch, for instance, in a matrix pattern. The openings are each formed in a rectangular shape or a circular shape having the same dimensional shape.

The entire shaping aperture member 203 is irradiated with an electron beam B substantially perpendicularly by the illuminating lens 202, the electron beam B being discharged from the electron gun 201. The electron beam B passes through a plurality of holes of the shaping aperture member 203, thereby forming a plurality of electron beams (multi beam) MB in a rectangular shape or the like.

In the blanking plate 204, through holes corresponding to the arrangement positions of the holes of the shaping aperture member 203 are formed. At each through hole, a set of two electrodes (blanker, blanking deflector) forming a pair is disposed. An amplifier that applies a voltage is disposed at one of the two electrodes for the beams, and the other electrode is grounded. An electron beam which passes through each through hole is independently deflected by a voltage which is applied to the two electrodes forming a pair. Blanking control is performed by the deflection of the electron beam.

The multi beam MB which has passed through the blanking plate 204 is reduced by the reducing lens 205, and travels to the central opening formed in the limiting aperture member 206. An electron beam deflected by the blanker of the blanking plate 204 is displaced from the central opening of the limiting aperture member 206, and shielded by the limiting aperture member 206. On the other hand, an electron beam undeflected by the blanker passes through the central opening of the limiting aperture member 206.

In this manner, the limiting aperture member 206 shields each beam which is deflected to assume a beam OFF state by an individual blanking mechanism. Then, the beam for one shot is formed by the beam which has passed through the limiting aperture member 206 and has been formed since a beam ON until a beam OFF is assumed.

The multi beam MB which has passed through the limiting aperture member 206 is focused by the objective lens 207 to form a pattern image with a desired reduction ratio, which is collectively deflected by the deflector 208 and the substrate 240 is irradiated with the pattern image. For instance, when the XY stage 232 moves continuously, the irradiation position of the beam is controlled by the deflector 208 so as to follow the movement of the XY stage 232.

The multi beam MB with which irradiation is performed at one time is ideally arranged with a pitch which is obtained by multiplying the arrangement pitch of the plurality of holes of the shaping aperture member 203 by the above-mentioned desired reduction ratio. The writing apparatus performs a writing operation by a raster scan system for continuously irradiating with a shot beam sequentially, and when writing a desired pattern, necessary beam is controlled at beam ON by blanking control according to the pattern.

Figure 10:
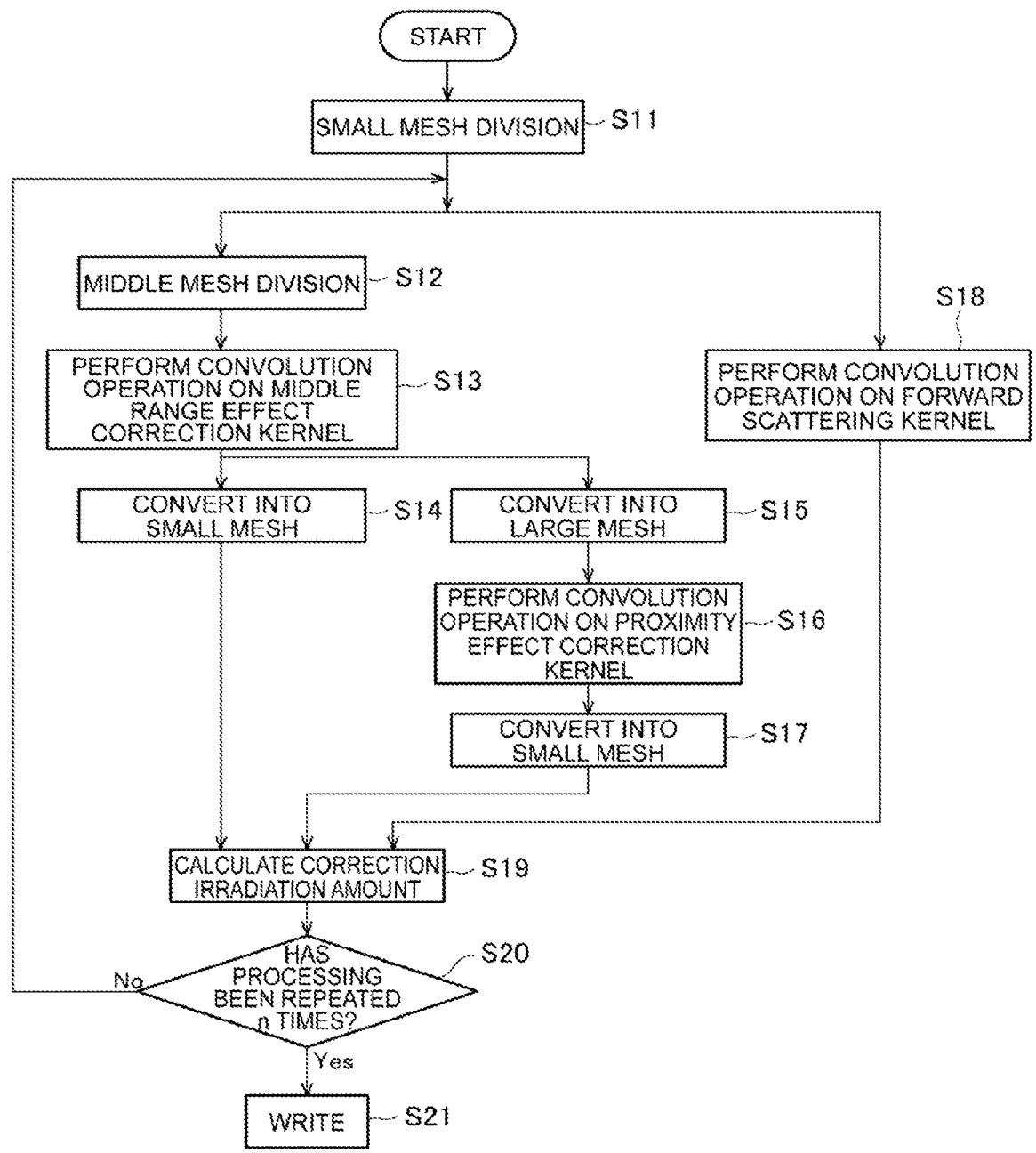
FIG. 10 is a flowchart illustrating a writing method according to another embodiment.
Figure 11:
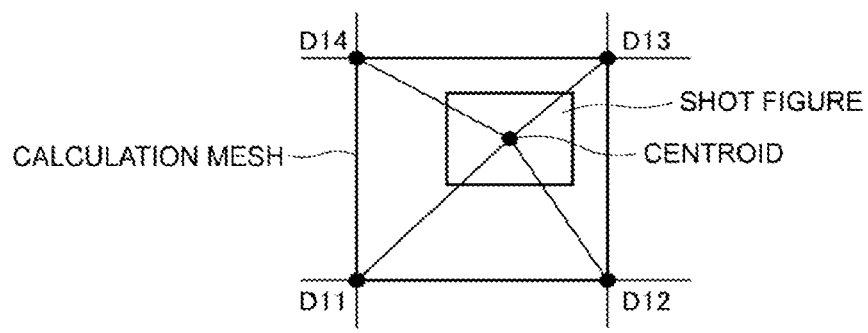
FIG. 11 is a figure illustrating an example of a shot figure and a calculation mesh.
Figure 12:
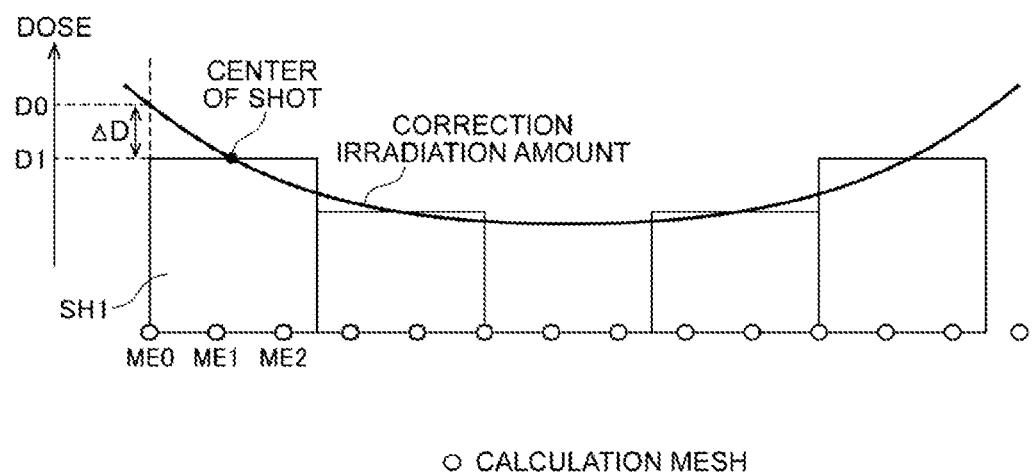
FIG. 12 is a chart illustrating an example of an insufficient irradiation amount at an edge portion of a shot figure.

The method of performing correction calculation using Expression 10, Expression 11 shown above, calculating an irradiation amount of each beam, and performing writing processing will be described with reference to the flowchart illustrated in FIG. 10.

First, the mesh division unit 101 virtually divides a writing region of the substrate 240 into a plurality of mesh regions in a grid pattern (step S11). The mesh division unit 11 divides a writing region into a small mesh size (a first mesh size) according to one beam size, for instance, approximately 10 nm. Hereinafter a mesh region in a small mesh size is also referred to as a small mesh region.

Subsequently, the area density calculation unit 102 reads writing data from the storage device 120, assigns a figure pattern to small mesh regions, and calculates a pattern area density of each small mesh region. Thus, first mesh data is obtained, in which the pattern area density of each small mesh region is defined.

The first mesh conversion unit 103 converts the first mesh data into second mesh data in a mesh size (a second mesh size) suitable for the middle range effect correction, for instance, a middle mesh size of approximately 100 nm (step S12). For instance, a plurality of small mesh regions are converted (combined) into one middle mesh region. The mesh value of the middle mesh region is calculated using the mesh values and positions of the plurality of small mesh regions.

The first convolution operation unit 107 uses the second mesh data as an input to perform a convolution operation on a middle range effect correction kernel, and generates third mesh data (step S13). The mesh value of the third mesh data provides an irradiation amount with the middle range effect corrected.

Similarly to the second mesh data, the third mesh data is mesh data in a middle mesh size. The second mesh conversion unit 104 converts the third mesh data into fourth mesh data in a small mesh size (step S14). The mesh value of a small mesh region is calculated by interpolation processing of the mesh values associated with the vertices of a middle mesh region. The first mesh data and the fourth mesh data have the same mesh size.

The third mesh conversion unit 105 converts the third mesh data into fifth mesh data in a mesh size (a third mesh size) suitable for the proximity effect correction, for instance, a large mesh size of approximately 1.6 µm (step S15).

The second convolution operation unit 108 uses the fifth mesh data as an input to perform a convolution operation on a proximity effect correction kernel, and generates sixth mesh data (step S16). The mesh value of the sixth mesh data provides an irradiation amount with the proximity effect corrected.

Similarly to the fifth mesh data, the sixth mesh data is mesh data in a large mesh size. The fourth mesh conversion unit 108 converts the sixth mesh data into seventh mesh data in a small mesh size (step S17). The first mesh data and the seventh mesh data have the same mesh size.

The third convolution operation unit 109 uses the first mesh data as an input to perform a convolution operation on a forward scattering kernel, and generates eighth mesh data (step S18).

The irradiation amount calculation unit 110 calculates forward scattering terms from the eighth mesh data, and adds a result of the calculation to the fourth mesh data and the seventh mesh data to determine a correction irradiation amount (step S19).

When the processing in steps S12 to S19 is repeated n times, for instance, three times or so (Yes in step S20), writing processing is performed (step S21). The writing controller 111 controls the writer MW via the control circuit 130 and the like, and performs writing processing. The writer MW controls each blanker of the blanking plate 204, and adjusts the irradiation amount of each beam based on the correction irradiation amount, and writes a pattern on the substrate 240.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam writing method comprising:
dividing a figure pattern into a plurality of shot figures in a size, each of which allows to be irradiated with a shot of a charged particle beam, by use of writing data defining the figure pattern;
virtually dividing a writing region of a writing target substrate into a mesh pattern which is a plurality of mesh regions, and calculating a correction irradiation amount to correct proximity effect and middle range effect for each of the plurality of mesh regions based on a position of the figure pattern, the middle range effect having an influence radius shorter than an influence radius of the proximity effect;
calculating an irradiation amount for each of the plurality of shot figures using the correction irradiation amount;
calculating an insufficient irradiation amount at an edge portion of the shot figure based on the irradiation amount;
resizing the shot figure based on the insufficient irradiation amount; and
writing the resized shot figure on the writing target substrate using a charged particle beam in the irradiation amount.

2. The method according to claim 1,
wherein a slope of a change in dose amount at the edge portion within the shot figure when the shot figure before resizing is written by the charged particle beam in the irradiation amount is calculated, and
an amount of resizing for the shot figure is calculated based on the insufficient irradiation amount and the slope.

3. The method according to claim 1,
wherein the irradiation amount for the shot figure is calculated from the correction irradiation amount for mesh regions around a centroid of the shot figure.

4. The method according to claim 1,
wherein a first irradiation amount is calculated from the correction irradiation amount for mesh regions around a centroid of the shot figure,
a second irradiation amount is calculated from the correction irradiation amount for mesh regions around the edge portion of the shot figure, and
the insufficient irradiation amount is set to ½ of a difference between the first irradiation amount and the second irradiation amount.

5. The method according to claim 1,
wherein a first irradiation amount is calculated from the correction irradiation amount for mesh regions around a centroid of the shot figure,
a second irradiation amount is calculated from the correction irradiation amount for mesh regions around an intersection point between the edge portion and a perpendicular line from the centroid to the edge portion, and
the insufficient irradiation amount is determined using the first irradiation amount and the second irradiation amount.

6. The method according to claim 1,
wherein a first irradiation amount is calculated from the correction irradiation amount for mesh regions around a centroid of the shot figure,
a plurality of evaluation points are set, and for each of the plurality of evaluation points, a second irradiation amount is calculated from the correction irradiation amount for mesh regions around the evaluation point,
the insufficient irradiation amount is calculated for each evaluation point using the first irradiation amount and the second irradiation amount,
an amount of resizing at each evaluation point is calculated from the insufficient irradiation amount, and
an average value of amounts of resizing at the evaluation points is calculated as an amount of resizing for the edge portion.

7. The method according to claim 6,
wherein the plurality of evaluation points include end points of the edge portion and an intersection point between a perpendicular line from the centroid to the edge portion and the edge portion.

8. A charged particle beam writing apparatus comprising:
a shot division unit dividing a figure pattern using writing data into a plurality of shot figures in a size, each of which allows to be irradiated with a shot of a charged particle beam, the writing data defining the figure pattern;

a correction processing unit virtually dividing a writing region of a writing target substrate into a mesh pattern which is a plurality of mesh regions, and calculating a correction irradiation amount to correct proximity effect and middle range effect for each of the plurality of mesh regions based on a position of the figure pattern, the middle range effect having an influence radius shorter than an influence radius of the proximity effect;

an insufficient irradiation amount calculation unit calculating an irradiation amount for each of the plurality of shot figures using the correction irradiation amount, and calculating an insufficient irradiation amount at an edge portion of the shot figure based on the irradiation amount;

a resizing processing unit resizing the shot figure based on the insufficient irradiation amount; and a writer writing the resized shot figure on the writing target substrate using a charged particle beam in the irradiation amount.

9. The apparatus according to claim 8, further comprising:

a dose slope calculation unit calculating a slope of a change in dose amount at the edge portion within the shot figure when the shot figure before resizing is written by the charged particle beam in the irradiation amount; and a resizing amount calculation unit calculating an amount of resizing for the shot figure based on the insufficient irradiation amount and the slope.

10. The apparatus according to claim 8, wherein the insufficient irradiation amount calculation unit calculates the irradiation amount for the shot figure from the correction irradiation amount for mesh regions around a centroid of the shot figure.

11. The apparatus according to claim 8, wherein the insufficient irradiation amount calculation unit calculates a first irradiation amount from the correction irradiation amount for mesh regions around a centroid of the shot figure, calculates a second irradiation amount from the correction irradiation amount for mesh regions around the edge portion of the shot figure, and sets the insufficient irradiation amount to ½ of a difference between the first irradiation amount and the second irradiation amount.

12. The apparatus according to claim 8, wherein the insufficient irradiation amount calculation unit calculates a first irradiation amount from the correction irradiation amount for mesh regions around a centroid of the shot figure, calculates a second irradiation amount from the correction irradiation amount for mesh regions around an intersection point between the edge portion and a perpendicular line from the centroid to the edge portion, and determines the insufficient irradiation amount using the first irradiation amount and the second irradiation amount.

13. The apparatus according to claim 8, wherein the insufficient irradiation amount calculation unit calculates a first irradiation amount from the correction irradiation amount for mesh regions around a centroid of the shot figure, sets a plurality of evaluation points, and for each of the plurality of evaluation points, calculates a second irradiation amount from the correction irradiation amount for mesh regions around the evaluation point, and calculates the insufficient irradiation amount for each evaluation point using the first irradiation amount and the second irradiation amount, and wherein the apparatus further includes a resizing amount calculation unit calculating an amount of resizing at each evaluation point from the insufficient irradiation amount, and calculating an average value of amounts of resizing at the evaluation points as an amount of resizing for the edge portion.

14. The apparatus according to claim 13, wherein the plurality of evaluation points include end points of the edge portion and an intersection point between a perpendicular line from the centroid to the edge portion and the edge portion.

* * * * *